United States Patent [19]

van Zanten et al.

[11] Patent Number: 5,007,007

[45] Date of Patent: Apr. 9, 1991

[54] CIRCUITRY FOR CONVERTING A MEASUREMENT SIGNAL DISTURBED BY A DISTURBANCE FUNCTION INTO AN UNDISTURBED SIGNAL

[75] Inventors: Anton van Zanten, Ditzingen; Friedrich Kost, Kornwestheim, both of Fed. Rep. of Germany

[73] Assignee: Robert Bosch GMBH, Stuttgart, Fed. Rep. of Germany

[21] Appl. No.: 348,001

[22] PCT Filed: Aug. 26, 1987

[86] PCT No.: PCT/EP87/00484

§ 371 Date: Apr. 7, 1989

§ 102(e) Date: Apr. 7, 1989

[87] PCT Pub. No.: WO88/02954

PCT Pub. Date: Apr. 21, 1988

[30] Foreign Application Priority Data

Oct. 8, 1986 [DE] Fed. Rep. of Germany ....... 3634239

[51] Int. Cl.[5] .................... G06F 15/31; H03F 1/26; G06G 7/00
[52] U.S. Cl. ............................... 364/574; 364/426.02; 364/724.19
[58] Field of Search .............. 364/574, 724.01, 724.02, 364/724.19, 724.20, 426.01, 426.02, 426.03, 148, 151

[56] References Cited

U.S. PATENT DOCUMENTS

| | | | |
|---|---|---|---|
| 4,524,424 | 6/1985 | White | 364/724.19 |
| 4,571,732 | 2/1986 | Pirani et al. | 364/724.20 X |
| 4,701,855 | 10/1987 | Fennel | 364/426.02 |
| 4,742,353 | 5/1988 | D'Addio et al. | 364/724.19 X |
| 4,789,994 | 12/1988 | Randall et al. | 364/724.20 X |
| 4,791,390 | 12/1988 | Harris et al. | 364/724.19 X |
| 4,794,538 | 12/1988 | Cao et al. | 364/426.03 X |

FOREIGN PATENT DOCUMENTS 86943 8/1983 European Pat. Off. .

OTHER PUBLICATIONS

1980 IEEE Int'l Symposium on Circuits & Systems Proceedings, vol. 3, IEEE, (US), McColl et al. Principals and Applications of Adaptive Filters-pp. 1143-1157.
IEEE Transactions on Power Apparatus and Systems, vol. PAS-104, No. 13, Dec. 1985, pp. 3341-3342.

Primary Examiner—Joseph L. Dixon
Attorney, Agent, or Firm—Felfe & Lynch

[57] ABSTRACT

Circuitry is disclosed for converting an input measurement signal $V_{R(i)}$, which is disturbed at least occasionally by a disturbance function, into an output, undisturbed signal $V_{R(o)}$ by means of a first digital adaptive filter having variable filter parameters. A control circuit is provided to change to parameters of the second adaptive filter to improve the ability of the system to filter out the disturbance signal. The apparatus includes a series circuit formed by a high pass filter and a second digital adaptive filter, coupled to receive the input signal $V_{R(i)}$. The control circuit switches the second adaptive filter to the adaptation mode, for determining the filter parameters necessary for suppression of the disturbance function n, when essentially only the disturbance signal reaches the second adaptive filter. Thereafter, the filter parameters of the second adaptive filter are transferred to the first adaptive filter to improve the performance of the first adaptive filter.

2 Claims, 2 Drawing Sheets

CIRCUITRY FOR CONVERTING A MEASUREMENT SIGNAL DISTURBED BY A DISTURBANCE FUNCTION INTO AN UNDISTURBED SIGNAL

BACKGROUND OF THE INVENTION

The invention relates to apparatus for converting a measurement signal $V_{R(i)}$, which is disturbed at least occasionally by a disturbance function into an undisturbed signal $V_{R(o)}$ by the use of a filter having variable filter parameters.

When the speed of a vehicle wheel, is measured for the purpose of brake-pressure control (ABS), for example, there is frequently impressed on the measurement signal $V_{R(i)}$ a disturbance signal of one or more specific frequencies which can distort the signals to be evaluated (e.g., the wheel-speed signal itself or its derivatives).

It is known quite generally that disturbance signals can be eliminated by filtering. However, the frequencies of the disturbances often are not known and, moreover, such frequencies are variable as a function of the given influences. So-called adaptive digital filters therefore lend themselves to such filtering; however, they must be adjusted so that only the disturbance signal is filtered out.

SUMMARY OF THE INVENTION

The present invention provides apparatus which determines the filter parameters for the disturbance signal, during periods in which the disturbance signal is available or represented separately, and, through a comparison, determines whether the newly determined parameters produce better filtering than the previously set parameters. If the new parameters would provide better filtering, the apparatus transfers these parameters to the actual filter (the first adaptive digital filter). Two so-called "adaptive ladder filters" are preferably used in this system.

When the ladder-filter parameters have been adapted to a disturbance signal, the desired signal (input signal minus disturbance signal) appears at the output of the filter. To make certain that the input signal contains no desired signal during the parameter determination, the disturbance signal is isolated from the input signal only at given times. For example, after a pressure reduction in a wheel brake cylinder in an antilock braking system, the wheel speed often shows oscillations which are also known as "axle oscillations". To filter these axle oscillations out of the wheel signal, the second adaptive ladder filter is switched to its adaptation mode when the wheel, after the pressure reduction, has again entered the stable region of the wheel-slip curve. The adaptation is discontinued, at the latest, when a pressure-buildup pulse occurs. After this adaptation, the new filter parameters are transferred to the first adaptive filter, which continuously filters the wheel signal $V_R$. If the new parameters would provide better filtering, the apparatus.

For a full understanding of the present invention, reference should now be made to the following detailed description of the preferred embodiments of the invention and to the accompanying drawings.

DESCRIPTION OF THE PREFERRED EMBODIMENT

Figure 1:
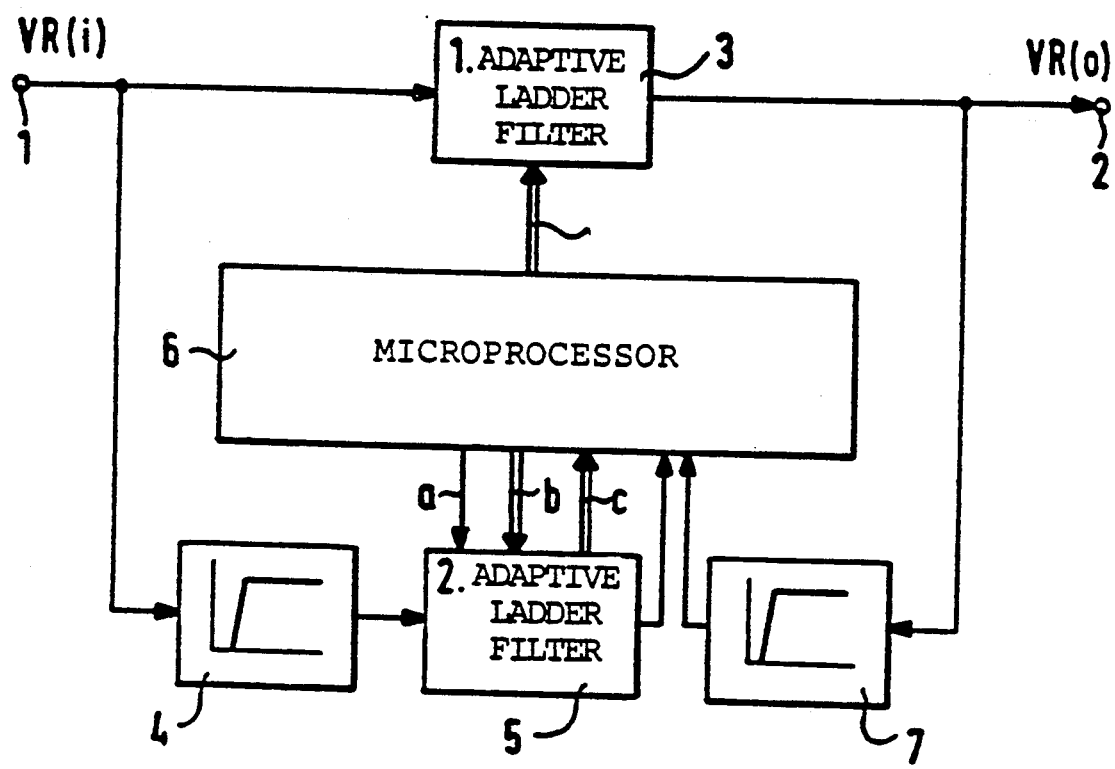
FIG. 1 is a block diagram of a preferred embodiment of the invention.

FIG. 1 illustrates apparatus for adaptive filtering of the disturbed signal $V_R$. $V_{R(i)}$ is the unfiltered wheel speed, and $V_{R(o)}$ the filtered wheel speed.

Inserted in the signal path between the terminals 1 and 2 is a first adaptive ladder filter 3. However, the wheel-speed signal $V_{R(i)}$ is also fed to a high-pass filter 4, which is followed by a second adaptive ladder filter 5. A microprocessor 6 is provided for controlling the filters 3 and 5. Moreover, a further high-pass filter 7 is provided to which the filtered signal $V_{R(o)}$ is fed. The outputs of the filters 5 and 7 are connected to a comparator in the microprocessor 6.

The adaptive filters 3 and 5 are controlled by a microprocessor with respect to their function. The microprocessor determines when the adaptation in the adaptive ladder filter 5 is to start and when it is to stop. The microprocessor further determines whether the new parameters are to be transferred to the adaptive ladder filter 3. For the latter determination, the output of the adaptive ladder filter 3 is filtered by means of the second high-pass filter 7 and the output of that high-pass filter 7 is compared in a comparator in the microprocessor 6 with the output of the adaptive ladder filter 5.

The wheel speed $V_{R(i)}$ is filtered continuously by means of the second adaptive ladder filter 3. The filtered wheel speed $V_{R(o)}$ is presented at the output of that ladder filter. Moreover, the wheel speeds $V_{R(i)}$ and $V_{R(o)}$ are filtered by means of the first high-pass filter 4 and the second high-pass filter 7, respectively. These high-pass filters, which are identical filter the mean value and the trend out of the wheel-speed signal.

The microprocessor 6 determines when the adaptation phase is to start. To this end, an appropriate signal is fed to the adaptive ladder filter 5 over the line a and the parameters of that filter, the so-called reflection coefficient and the covariance, are initialized as needed over the line b. The initial values of these parameters are made default values, for example, adapted to the values of the filter 3.

The microprocessor further determines when the parameter estimation in the adaptive ladder filter 5 is to be terminated. When this is to be done, the microprocessor delivers an appropriate signal over the line a.

If the parameters determined by the adaptive ladder filter 5 are to be transferred to the adaptive ladder filter 3, the microprocessor reads the parameters from the adaptive filter 5 over line c and writes them into the adaptive ladder filter 3 over the line d.

The microprocessor determines whether to transfer the parameters on the basis of a comparison of the outputs of the adaptive ladder filter 5 and of the second high-pass filter 7. This determination can be made on the basis of various factors. One possible basis would be the covariance (square of standard deviation from the disturbance signal) of the two output signals. The determination would then be as follows: If the covariance of the output of the second high-pass filter 7 is greater than that of the adaptive ladder filter 5, then the (disturbance) signal at the output of filter 7 is greater than the (disturbance) signal at the output of filter 5, and the adaptive ladder filter 3 is no longer optimally adapted.

The parameters of the adaptive ladder filter 5 are transferred to the first adaptive ladder filter 3.

The adaptive ladder filters, and particularly the standardized form of such adaptive ladder filters, could easily be designed as VLSI modules since their structure is recursive. Such modules are well known in the art. The high-pass filters may also be structured as VLSI modules or implemented in the microprocessor. The algorithms of the high-pass filters are also well known in the art. The algorithms of both the nonstandardized and the standardized adaptive ladder filters are given in the Appendix.

Figure 2A:
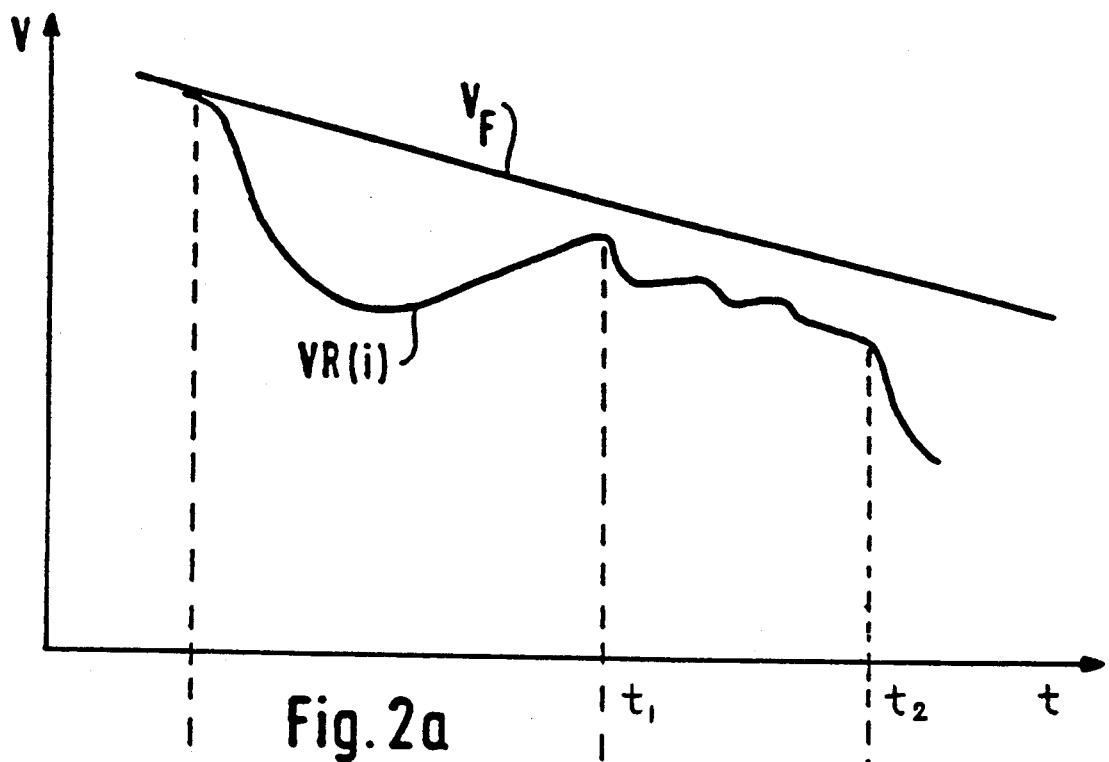
FIG. 2, comprised of FIGS. 2a and 2b, are signal diagrams illustrating the operation of the apparatus of FIG. 1.

FIG. 2a shows examples of the curves of the vehicle speed $V_F$ and the wheel speed $V_{R(i)}$ of a braked vehicle with antilock braking control. Here a disturbance known as axle oscillation occurs in the region from $t_1$ to $t_2$. This disturbance may be sufficient to trigger, needlessly, a new pressure reduction (through a retardation signal, for example).

Figure 2B:
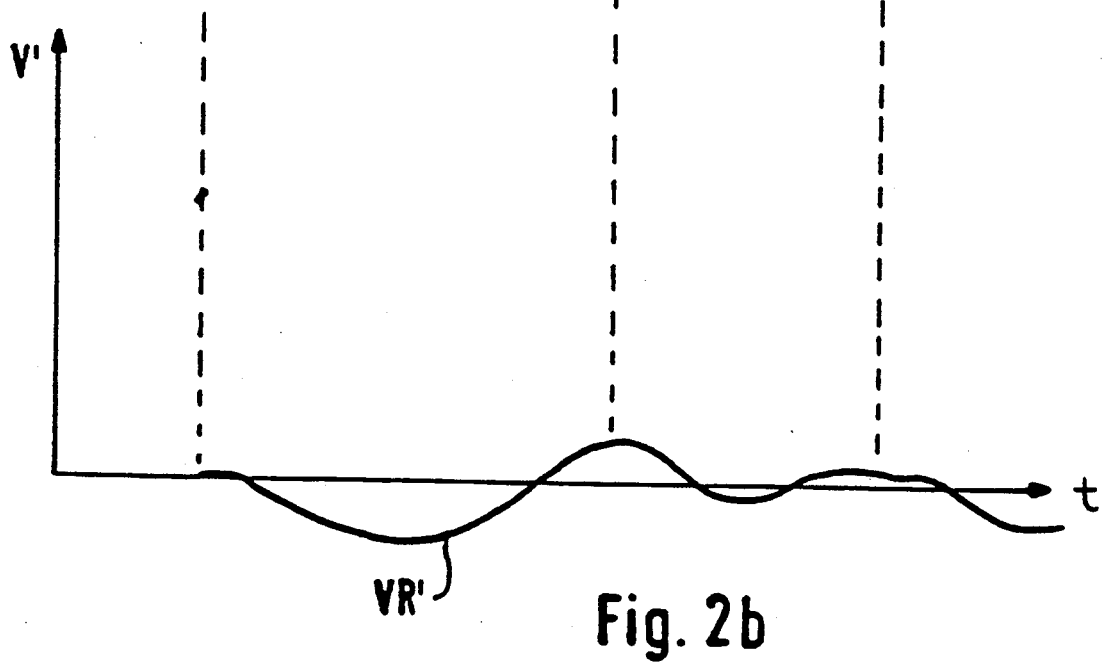

From this, the curve of the speed signal $V_R'$ of FIG. 2b is obtained by means of the high-pass filter 4 of FIG. 1. During the period from $t_1$ to $t_2$ there is substantially no change in wheel speed so that only the disturbance signal is present. In the ladder filter 5, which is enabled by the microprocessor 6, the filter parameters for filtering out this disturbance are determined during this period (i.e., in the adaptation mode.) In the next control cycle, during the periods corresponding to $t_2$ to the next $t_1$, the outputs of the filters 5 and 7 are compared with each other in the microprocessor 6 and a determination is made whether the filter combination 3 and 7 or the filter combination 4 and 5 best filters out the disturbance signal. If the filtering action of the filter combination 4 and 5 is better, then the parameters determined by the ladder filter 5 for filtering out the disturbance are transferred to the ladder filter 3.

Thus, the determination of parameters in the ladder filter 5 is not continuous but is only effected periodically.

The determination of the period from $t_1$ to $t_2$ in the parameter determination in the ladder filter is performed with the aid of the signals from the antilock braking controller. That period may correspond, for example, to the pressure-holding phase following a pressure reduction after which an acceleration threshold is undershot.

There has thus been shown and described a novel circuit for converting a measurement signal, disturbed by a disturbance function, into an undisturbed signal, which circuit fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention which is limited only by the claims which follow.

APPENDIX

Algorithm for the second standardized adaptive ladder filter

Let $Y_T$ be the signal present at time T at the input of the filter, that is, the high-pass-filtered wheel speed VRADL(i). At the start of the parameter estimation, T=0.

The following parameters may be selected at will as needed:
nmax (maximum filter order)
$\gamma$ (forget factor, where $0 < \gamma \leq 1$)
$\sigma$ (initial covariance)
Calculated are, inter alia:
$R_T$ (the covariance estimation at time T)
$\rho_{n,T}$ (the nth reflection coefficient at time T)

When the algorithm is initialized at time T=0, the following is set:

$$R_0 = \sigma + Y_0^2$$

$$v_{0,0} = \eta_{0,0} = Y_0 \cdot R_0^{-\frac{1}{2}}$$

$$\rho_{1,0} = 0, \rho_{2,0} = 0, \ldots, \rho_{nmax,0} = 0$$

For the next times, T=1, T=2 and so forth, until the parameter estimation is broken off, the following is calculated:

$$R_T = \lambda \cdot R_{T-1} + Y_T^2$$

$$v_{o,T} = \eta_{o,T} = Y_T R_T^{-\frac{1}{2}}$$

For n=o to [min (T,nmax)−1] calculate $$\rho_{n+1,T} = \rho_{n+1,T-1} \cdot (1 - v_{n,T}^2)^{\frac{1}{2}} (1 - \eta_{n,T-1}^2)^{\frac{1}{2}} + v_{n,T} \cdot \eta_{n,T-1}$$

$$v_{n+1,T} = [v_{n,T} - \rho_{n+1,T} \cdot \eta_{n,T-1}] \cdot (1 - \rho_{n+1,T}^2)^{-\frac{1}{2}} \cdot (1 - \eta_{n,T-1}^2)^{-\frac{1}{2}}$$

$$\eta_{n+1,T} = [\eta_{n,T-1} - \rho_{n+1,T} \cdot v_{n,T}] \cdot (1 - \rho_{n+1,T}^2)^{-\frac{1}{2}} \cdot (1 - v_{n,T}^2)^{-\frac{1}{2}}$$

Algorithm for the first standardized adaptive ladder filter

Let $Y_T$ be the signal present at time T at the filter input, that is, the wheel speed VRAD(i). At the start of the parameter estimation, T=0.

The filter order must be the same as that of the second ladder filter (nmax). The reflection coefficients are either initialized or taken over from the second ladder filter. ($\rho_1, \rho_2, \ldots \rho_{nmax}$.)

At time T=0, there is set:

$$v_{0,0} = \eta_{0,0} = Y_0$$

For every further time, T=1, T=2 and so forth, the following is calculated:

$$v_{0,T} = \eta_{0,T} = Y_T$$

For n=0 to [min{T,nmax}−1] calculate $$v_{n+1,T} = v_{n,T} - \rho_{n+1} \cdot \eta_{n,T-1}$$

$$\eta_{n+1,T} = \eta_{n,T-1} - \rho_{n+1} \cdot v_{n,T}$$

Since the calculations have been carried out by the time $T = T_k$, $$v_{nmax, T_k} = VRAD(o),$$

that is, vnmax, Tk is the filtered wheel speed at time $T=T_k$.

Algorithm for the second nonstandardized adaptive ladder filter

Let $Y_T$ be the signal present at time T at the filter input, that is, the high-pass-filtered wheel speed VRAD(i). At the start of the parameter estimation, $T=0$.

The following parameters may be selected at will as needed.

nmax (maximum filter order)
$\lambda$ (forget factor, where $0 < \lambda \leq 1$)
$\sigma$ (initial covariance)

Calculated are, inter alia:
$\Delta_{n,T}$ (correlation)
$R^\epsilon_{n,T}$ (forward covariance)
$R^r_{n,T}$ (Backward covariance)
$K^\epsilon_{n,T}$ (Forward reflection coefficient)
$K^r_{n,T}$ (Backward reflection coefficient)

If the algorithm is initialized at time $T=0$, the following is set:

$$R^\epsilon_{0,0} = Y^2_0 + \sigma$$

$$R^r_{0,0} = Y^2_0 + \sigma$$

$$\epsilon_{0,0} = Y_0$$

$$r_{0,0} = Y_0$$

$$\Delta_{1,0}=0, \Delta_{2,0}=0, \ldots, \Delta_{nmax,0}=0$$

For the next times, $T=1$, $T=2$ and so forth, until the parameter estimation is terminated, the following is calculated:

$$\epsilon_{0,T} = Y_T$$

$$r_{0,T} = Y_T$$

$$\gamma_{1,T} = 0$$

$$R^\epsilon_{0,T} = \lambda R^\epsilon_{0,T-1} + Y^2_T$$

$$R^r_{0,T} = \lambda R^r_{0,T-1} + Y^2_T$$

and so forth.

For $n=0$ to $[\min(T,nmax)-1]$ calculate $$\Delta_{n+1,T} = \lambda \Delta_{n+1,T-1} + \frac{r_{n,T-1} \cdot \epsilon_{n,T}}{1 - \gamma_{n,T}}$$

$$\gamma_{n,T} = \gamma_{n-1,T} + (R^r_{n,T})^{-1} \cdot r^2_{n,T}$$

$$K^\epsilon_{n+1,T} = \Delta_{n+1,T}(R^\epsilon_{n,T})^{-1}$$

$$K^r_{n+1,T} = \Delta_{n+1,T}(R^r_{n,T})^{-1}$$

$$\epsilon_{n+1,T} = \epsilon_{n,T} - K^r_{n+1,T} r_{n,T-1}$$

$$r_{n+1,T} = r_{n,T-1} - K^\epsilon_{n+1,T} \epsilon_{n,T}$$

$$\left.\begin{array}{l} R^\epsilon_{n+1,T} = R^\epsilon_{n,T} - \Delta^2_{n+1,T} \cdot (R^r_{n,T-1})^{-1} \\ R^r_{n+1,T} = R^r_{n,T-1} - \Delta^2_{n+1,T} \cdot (R^\epsilon_{n,T})^{-1} \end{array}\right\} \text{only if } T < n\text{max}$$

$$\left.\begin{array}{l} R^\epsilon_{n+1,T} = \lambda R^\epsilon_{n+1,T-1} + \epsilon^2_{n+1,T} \cdot (1 - \gamma_{n,T})^{-1} \\ R^r_{n+1,T} = \lambda R^r_{n+1,T-1} + r^2_{n+1,T} \cdot (1 - \gamma_{n,T})^{-1} \end{array}\right\} \text{only if } T \geq n\text{max}$$

Algorithm for the first nonstandardized adaptive ladder filter

Let $Y_T$ be the signal present at time T at the filter input, that is, the wheel speed VRAD(i). At the start of the parameter estimation, $T=0$. The filter order must be the same as that of the second ladder filter ($n_{max}$). The reflection coefficients are either initialized or taken over from the second ladder filter. ($R^\epsilon_1, R^\epsilon_2, \ldots, R^\epsilon_{nmax}, R^r_1, R^r_2, \ldots, R^r_{nmax}$)

At time $T=0$, there is set:

$$\epsilon_{0,0} = r_{0,0} = Y_0$$

For every further time, $T=1$, $T=2$ and so forth, the following is calculated:

For $\epsilon_{0,T} = Y_T$ $r_{0,T} = Y_T$

For $n=0$ to $[\min\{T,n_{max}\}-1]$ calculate $$\epsilon_{n+1,T} = \epsilon_{n,T} - K^r_{n+1,T} r_{n,T-1}$$

$$r_{n+1,T} = r_{n,T-1} - K^\epsilon_{n+1,T} \epsilon_{n,T}$$

Since the calculations have been carried out by the time $T=T_K$ $$\epsilon_{nmax,TK} = VRAD(o)$$

that is, $\epsilon_{nmax,TK}$ is the filtered wheel speed at time $T=T_K$.

We claim:

1. Anti-lock brake control system having means for converting an input measurement signal $V_{R(i)}$, which is disturbed at least occasionally by a disturbance function, into an undisturbed, output signal $V_{R(o)}$, said system comprising, in combination:
   (a) a first digital adaptive ladder filter, having variable filter parameters and coupled to receive said input signal $V_{R(i)}$, for producing a filtered output signal $V_{R(o)}$ in which a disturbance signal is suppressed;
   (b) a first high pass filter coupled to receive said input signal $V_{R(i)}$;
   (c) a second digital adaptive ladder filter, having variable filter parameters and coupled to said first high pass filter downstream thereof; and
   (d) control means, coupled to said first and second digital adaptive ladder filters, for switching said second adaptive filter to the adaptation mode in response to undershooting a wheel acceleration threshold after a pressure reduction, whereupon said second filter determines the filter parameters necessary for suppression of the disturbance function, and for transferring the filter parameters so determined from said second adaptive filter to said first adaptive filter.

2. The system of claim 1, further comprising a second high pass filter responsive to the output signal $V_{R(o)}$, and comparator means, responsive to the outputs of said second adaptive filter and said second high pass filter, for determining whether the adaptation of said second adaptive filter is better than that of said first adaptive filter, said control means causing the transfer of said filter parameters to said first adaptive filter in response to such determination.

* * * * *